United States Patent [19]
Yoshitani

[11] Patent Number: 5,904,169
[45] Date of Patent: May 18, 1999

[54] APPARATUS FOR AND METHOD OF TREATING SUBSTRATE

[75] Inventor: Mitsuaki Yoshitani, Hikone, Japan

[73] Assignee: Dainippon Screen Mfg. Co., Ltd., Japan

[21] Appl. No.: 08/712,449

[22] Filed: Sep. 11, 1996

[30] Foreign Application Priority Data

Sep. 27, 1995 [JP] Japan ................................. 7-249653

[51] Int. Cl.$^6$ ........................ F16K 21/16; F16K 31/02; F16K 33/00
[52] U.S. Cl. ................... 137/2; 134/104.2; 134/122 R; 134/182; 134/186; 134/902; 137/386; 137/392; 222/64
[58] Field of Search ............................... 137/1, 386, 392, 137/2; 134/122 R, 104.2, 113, 182, 183, 186, 902; 73/304 R; 222/64

[56] References Cited

U.S. PATENT DOCUMENTS

| 3,425,952 | 2/1969 | Gaughan et al. ................ 137/392 |
| 3,524,457 | 8/1970 | Laimbock ........................... 137/386 |
| 4,388,276 | 6/1983 | Konstantouros et al. ........ 137/386 |
| 5,150,727 | 9/1992 | D'Amato ........................... 134/104.2 |
| 5,247,953 | 9/1993 | D'Amato ........................... 134/104.2 |

FOREIGN PATENT DOCUMENTS

| 63-19331 | 6/1985 | Japan . |
| 2-34381 | 8/1990 | Japan . |
| 7-37311 | 12/1991 | Japan . |

*Primary Examiner*—George L. Walton
*Attorney, Agent, or Firm*—Ostrolenk, Faber, Gerb & Soffen, LLP

[57] ABSTRACT

An apparatus for treating a substrate with a predetermined treatment liquid includes: a first storing portion for storing the treatment liquid; a supplying device for supplying the treatment liquid stored by the first storing device to the substrate located at a predetermined position; a receiving portion for receiving the treatment liquid supplied to the substrate after applied to the substrate; a second storing portion for storing the treatment liquid received by the receiving device; an introducing system for introducing the treatment liquid stored by the second storing portion to the first storing portion; and a controlling device for controlling the introducing system so as to prevent bubbles included in the treatment liquid stored by the second storing portion from introduction to the first storing portion.

25 Claims, 6 Drawing Sheets

APPARATUS FOR AND METHOD OF TREATING SUBSTRATE

BACKGROUND OF THE INVENTION

This invention relates to an apparatus for and method of treating substrate such as semiconductor wafer and glass substrate for liquid crystal display by applying a treatment liquid to the substrate, e.g., by means of spraying.

A variety of substrate treating apparatuses have been manufactured, for example, cleaning apparatus, developing apparatus, etching apparatus, and resist-removing apparatus. Generally, such substrate treating apparatus includes a treatment section for applying treatment liquid to a substrate, a tank for storing the treatment liquid, and a pump for flowing the treatment liquid from the tank to the treatment section. A plurality of substrates are successively transferred in the treatment section, and transferred out to next section after being treated with the treatment liquid supplied by a liquid supplier, e.g., spraying device, provided in the treatment section. The treatment liquid applied to a substrate is reflowed into the tank. The restored treatment liquid is flowed again to the liquid supplier of the treatment section by the pump. In this way, the treatment liquid is used in a circulating manner to treat substrate.

In such substrate treating apparatuses, many bubbles are generated in the treatment liquid because of the spraying of the treatment liquid towards the substrate and of falling impact of the treatment liquid from the substrate. Generated bubbles are carried to the tank and then dispersed in the treatment liquid stored in the tank. The treatment liquid containing bubbles is flowed to the treatment liquid supplier, and finally applied to a substrate.

If treatment liquid containing bubbles is applied to a substrate, bubbles deposit on a front surface of the substrate, thereby deteriorating a uniform treatment of the front surface of the substrate. Further, the presence of bubbles in the tank prevents an efficient function of the pump, leading to an unstable flow of treatment liquid. Furthermore, treatment liquid is subject to acidification due to an increased contact area between the treatment liquid and the air caused by the presence of bubbles. This accelerates deterioration of the treatment liquid. Accordingly, it is essential to suppress the generation of bubbles in treatment liquid in such substrate treating apparatuses.

In view of these problems, a variety of ways have been proposed to suppress the generation of bubbles in treatment liquid. For example, there has been proposed use of a spraying device whose spray holes are formed into such a shape that bubbles are unlikely to generate. Also, a slanted plate is provided below a substrate in a treatment section. In this construction, treatment liquid falling down from the substrate is received by this slanted plate to decrease a falling impact of the treatment liquid and prevent the treatment liquid from becoming turbulent. Also, there has been proposed addition of antifoaming agent to treatment liquid to make the treatment liquid less subject to bubbling. Further, there has been proposed use of a treatment liquid supplier having no spraying device.

However, these conventional bubble suppressing ways cannot completely prevent bubbles from generating and increasing over time. Particularly in the case that a spraying device is used as treatment liquid supplier, the generation of bubbles is so considerable that a system for circulating the treatment liquid is clogged by bubbles within a short period of time even if one of the above bubble suppressing ways is adopted.

Also, the addition of antifoaming agent has a likelihood of adversely affecting the treatment of substrate depending upon components of antifoaming agent.

SUMMARY OF THE INVENTION

It is an object of the present invention to provide an apparatus for and method of treating a substrate which has overcome the problems residing in the prior art.

It is another object of the present invention to provide an apparatus for and method of treating a substrate which can securely prevent adverse influence of bubbles to circulated treatment liquid.

According to the present invention, an apparatus for treating a substrate with a predetermined treatment liquid, comprising: first storing means for storing the treatment liquid; supplying means for supplying the treatment liquid stored by the first storing means to the substrate located at a predetermined position; receiving means for receiving the treatment liquid supplied to the substrate after applied to the substrate; second storing means for storing the treatment liquid received by the receiving means; introducing means for introducing the treatment liquid stored by the second storing means to the first storing means; and controlling means for controlling the introducing means so as to prevent bubbles included in the treatment liquid stored by the second storing means from introduction to the first storing means.

It may be appreciated to provide the controlling means with detecting means for detecting level of the treatment liquid stored by the second storing means to detect that the level reaches a predetermined lower limit, and means for controlling the introducing means in accordance with the detected result of the detecting means so that the treatment liquid stored by the second storing means is not introduced to the first storing means when the detecting means detects that the level reaches the lower limit.

The treating apparatus may be further provided with second detecting means for detecting level of the treatment liquid stored by the second storing means to detect that the level reaches a predetermined upper limit; and means for controlling the introducing means in accordance with the detected result of the second detecting means so that the treatment liquid stored by the second storing means is started to be introduced to the first storing means when the second detecting means detects that the level reaches the upper limit.

The introducing means may be constructed by an introducing passage through which the treatment liquid stored by the second storing means can flow down to the first storing means. The controlling means may be provided with a valve in the introducing passage for permitting and interrupting the flow of the treatment liquid from the second storing means to the first storing means.

Also, the introducing means may be constructed by a recovering passage which connects the second storing means with the first storing means. The controlling means may be provided with a pump in the recovering passage for sending the treatment liquid stored by the second storing means to the first storing means.

Further, the introducing means may be constructed by means for connecting the second storing means with the first storing means so that level of the treatment liquid stored by the second storing means is normally identical with that stored by the first storing means by connecting a bottom of the second storing means with a predetermined position of the first storing mean. In this case, the predetermined position is made to be higher than the predetermined lower limit of the second storing means.

The treating apparatus may be further provided with second supplying means for supplying new treatment liquid to the first storing means, and supply controlling means for controlling the operation of the second supplying means.

The supply controlling means may be provided with level detecting means for detecting whether level of the treatment liquid stored by the first storing means reaches a predetermined lower level; and means for controlling the operation of the second supplying means in accordance with the detected result of the level detecting means so that the operation of the second supplying means starts when the level detecting means detects that the level of the treatment liquid stored by the first storing means reaches the predetermined lower level.

The supply controlling means may be further provided with second level detecting means for detecting whether level of the treatment liquid stored by the first storing means reaches a predetermined upper level; and means for controlling the operation of the second supplying means in accordance with the detected result of the second level detecting means so that the operation of the second supplying means ceases when the second level detecting means detects that the level of the treatment liquid stored by the first storing means reaches the predetermined upper level.

The treating apparatus may be further provided with means for discharging the treatment liquid stored by the second storing means.

It may be appreciated to provide the receiving means with a guiding plate slanted towards the second storing means for gathering the treatment liquid falling down from the substrate.

The second storing means may be provided with a slanted bottom wall for gathering the treatment liquid at the bottom of the second storing means.

Also, the present invention is directed to a method of treating a substrate with a predetermined treatment liquid, comprising the steps: supplying the treatment liquid into a treatment section from a tank in which the treatment liquid is stored; applying the supplied treatment liquid onto the substrate located in the treatment section; collecting the treatment liquid falling down from the substrate; storing the collected treatment liquid in a storage section, the collected treatment liquid including bubbles generated by falling down of the treatment liquid from the substrate to the storage section; and recovering the treatment liquid stored by the storage section to the tank with remaining the bubbles in the storage section.

With thus constructed substrate treating apparatus, the second storing means is provided to store the treatment liquid falling from the substrate and allow bubbles generated in the course of falling to rise to a surface of the stored treatment liquid. The treatment liquid is kept in the second storing means in such a manner that the bubbles in the stored treatment liquid are prevented from being introduced to the first storing means. Accordingly, the treatment liquid stored in the first storing means is free from bubbles. There is no likelihood that the treatment liquid carrying bubbles is applied to a substrate, which thus assures uniform application of treatment liquid over the substrate. Also, this will eliminate defective supply of treatment liquid which has been caused by the presence of bubbles in the conventional apparatus.

The detecting means is provided to detect whether the stored treatment liquid lowers beyond the predetermined lower limit. The storage of the treatment liquid in the second storing means is adjusted by controlling the operation of the introducing means by the controlling means. This will enable automatic and accurate storing control of treatment liquid in the storage section.

Further, there is provided the second detecting means. The controlling means controls the operation of the introducing means in accordance with the detected result of the second detecting means. Accordingly, the treatment liquid can be prevented for staying in the second storing means greater than a necessary amount.

The valve is provided in the introducing passage for introducing the treatment liquid from the second storing means to the first storing means. The provision of the valve ensures easier and more accurate control of the flow of treatment liquid. Also, the pump is provided in the recovering passage connecting the second storing means with the first storing means, thereby assuring forcible recovery of the treatment liquid.

In the arrangement where the bottom of the second storing means is connected with the predetermined position of the first storing means by the connecting means and the predetermined position is higher than the lower limit of the second storing means, the treatment liquid can be kept in the second storing means at the lower limit without providing such accessory parts as level detecting sensor, controller, control valve. This will provide an inexpensive apparatus.

Also, the second supplying means is provided to supply new treatment liquid to the first storing means, thereby assuring supply of fresh treatment liquid into the treating apparatus. The second supplying means is controlled by the supply controlling means having the lower level detecting means and further the upper level detecting means. Accordingly, the level of the treatment liquid in the first storing means can be reliably controlled.

Furthermore, the inventive treating apparatus is provided with the discharging means for discharging the treatment liquid stored by the second storing means. This enables the treatment liquid to be discharged from the second storing means at a desired time.

In the arrangement of the receiving means being provided with the guiding plate slanted towards the second storing means, the treatment liquid falls onto the slanted guiding plate from the substrate. Accordingly, the falling impact is weakened by the slant of the guiding plate, thereby suppressing the generation of bubbles.

In the arrangement of the second storing means being formed with the slanted bottom, similarly, the treatment liquid falls onto the slanted bottom from the substrate. Accordingly, the falling impact is weakened by the slant of the bottom, thereby suppressing the generation of bubbles.

According to the method of the present invention, moreover, the treatment liquid falling from the substrate is collected and stored in the storage section in a specified amount to allow generated bubbles to rise to a surface of the stored treatment liquid. Thereafter, the treatment liquid is recovered from the storage section to the tank in such an amount that the bubbles stays over the surface of the treatment liquid stored in the storage section. This will prevent the bubbles from dispersing in the treatment liquid stored in the tank. There will be no likelihood that the treatment liquid carrying bubbles is applied to the substrate, which thus assures uniform application of treatment liquid over the substrate. Also, this will eliminate defective supply of treatment liquid which has been caused by the presence of bubbles in the conventional apparatus.

These and other objects, features and advantages of the present invention will become more apparent upon a reading of the following detailed description and accompanying drawings.

DETAILED DESCRIPTION OF THE PREFERRED EMBODIMENTS OF THE INVENTION

Figure 1:
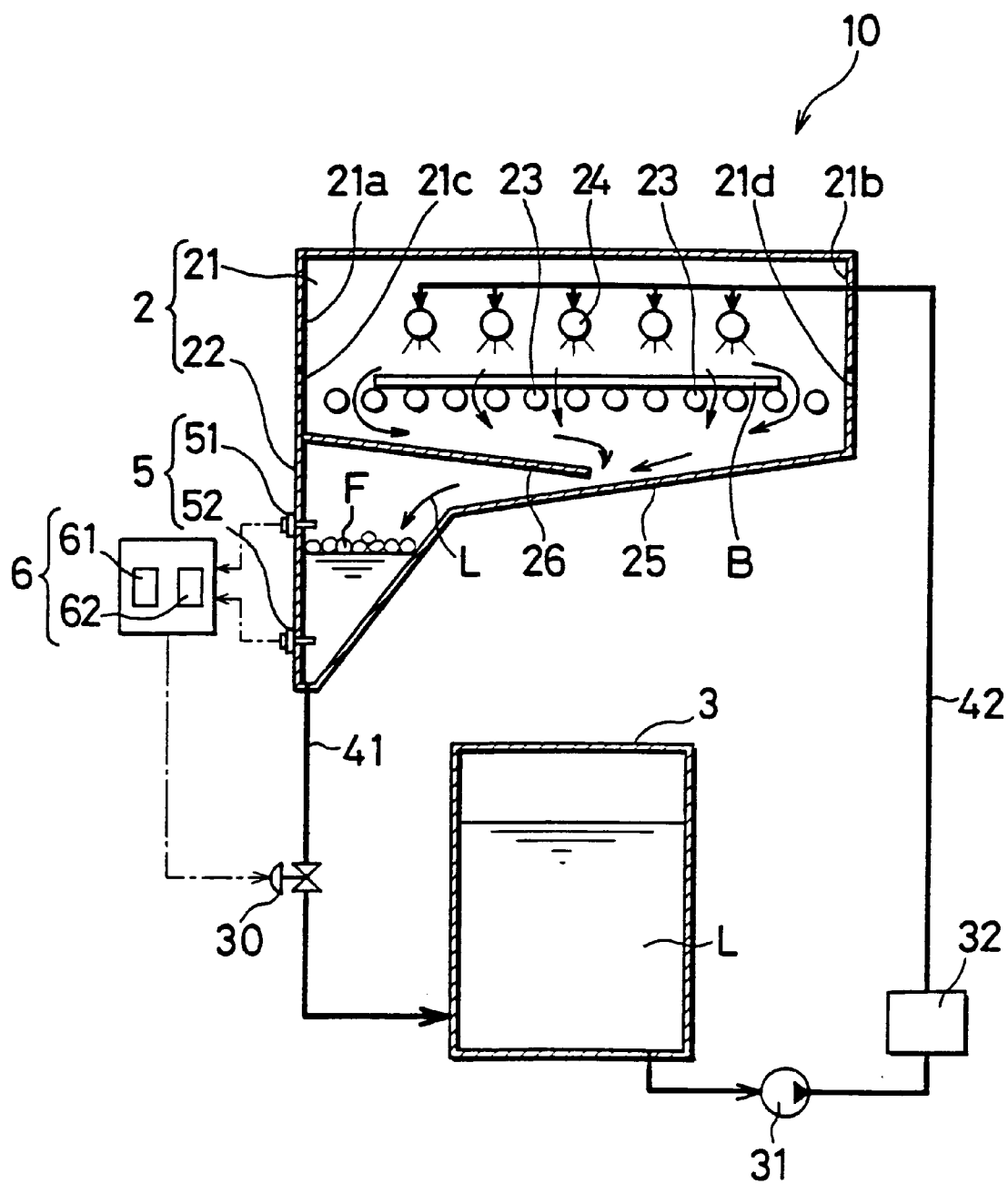
FIG. 1 is a diagram showing a first substrate treating apparatus according to the present invention.

FIG. 1 is a diagram showing a first substrate treating apparatus 10 according to the invention. The substrate treating apparatus 10 basically includes a treatment section 2 for treating a substrate B and a tank 3 for storing treatment liquid L used to treat the substrate B. The treatment section 2 is disposed such that the lowest height of the treatment liquid surface thereof is higher than the height of the treatment liquid surface in the tank 3.

The treatment section 2 has a substrate treatment chamber 21 for treating the rectangular substrate B introduced thereinto and a treatment liquid storage section 22 below the substrate treatment chamber 21.

The substrate treatment chamber 21 includes an upstream opening 21c and a downstream opening 21d located at the same height which are formed in an upstream wall 21a and a downstream wall 21b, respectively. Inside the substrate treatment chamber 21, a plurality of rows of rollers 23 having shafts normal to a direction of conveyance of the substrate B are arranged side by side at the same height as the openings 21c and 21d.

The substrate B is introduced into the substrate treatment chamber 21 through the upstream opening 21c by the rotation of the rows of the rollers 23, and are transferred to a next chamber through the downstream opening 21d after being treated in a specified manner.

A plurality of spray nozzles 24 are arranged above the rows of rollers 23. The specified treatment is applied to a front surface of the substrate B on the rollers 23 by spraying the treatment liquid L from the spray nozzles 24.

The substrate treatment chamber 21 has a bottom wall 25 which is slanted downward from the bottom end of the downstream wall 21b toward the upstream wall 21a. The bottom end of the slanted bottom wall 25 is connected with an upper end of the treatment liquid storage section 22. Also, the substrate treatment chamber 21 is provided with a treatment liquid guiding plate 26 extending from the upstream wall 21a. The guiding plate 26 is slanted downward to face the slanted bottom wall 25.

The treatment liquid L is introduced to the treatment liquid storage section 22 after flowing down along the guiding plate 26 and the slanted bottom wall 25. After the treatment of the substrate B, the treatment liquid L falls upon the guiding plate 26 and the slanted bottom wall 25 and comes into the treatment liquid storage section 22. Accordingly, it will be seen that the falling space is smaller as compared to the case where treatment liquid is allowed to directly fall onto a surface of treatment liquid in a treatment liquid storage section. This will reduce the falling impact, thereby suppressing generation of bubbles in the treatment liquid L.

The tank 3 is adapted to store the treatment liquid L used in the treatment section 2. The treatment liquid L stored in the treatment liquid storage section 22 is introduced into the tank 3 via a recovery passage 41 connecting a bottom of the treatment liquid storage section 22 of the treatment section 2 and a side of the tank 3 at its bottom.

A control valve 30 is disposed in the recovery passage 41, and the flow of the treatment liquid L from the treatment liquid storage section 22 to the tank 3 is permitted and blocked by opening and closing the control valve 30.

The bottom of the tank 3 and the spray nozzles 24 are connected by a supply passage 42 via a circulating pump 31. By driving the circulating pump 31, the treatment liquid L is supplied to the spray nozzles 24 from the tank 3. Further, a filter 32 is provided in the supply passage 42 downstream from the circulating pump 31 to purify the treatment liquid L before being supplied to the spray nozzles 24. The supply passage 42, the circulating pump 31, and the filter 32 constitute a supplying system.

As mentioned above, the treatment liquid L is flowed into the supply passage 42 from the tank 3 by driving the circulating pump 31, supplied to the spray nozzles 24 after being purified by the filter 32, and sprayed onto the substrate B on the rows of rollers 23 by the spray nozzles 24. The specified treatment is applied to the front surface of the substrate B by spraying the treatment liquid L onto the substrate B. The treatment liquid L which has been used to treat the substrate B falls onto the slanted bottom wall 25 and the guiding plate 26 from the peripheries of the substrate B, flows down therealong, and is temporarily stored in the treatment liquid storage section 22.

In the treatment liquid storage section 22, an upper limit and a lower limit of the treatment liquid L to be stored are set in advance. A capacitance type level sensor unit 5 is provided to detect that the level of the treatment liquid L is in the upper or lower limit. The level sensor unit 5 includes an upper limit sensor 51 for detecting that the level of the treatment liquid L is in the upper limit and a lower limit sensor 52 for detecting that the level of the treatment liquid L is in the lower limit. The respective sensors 51, 52 detect that the treatment liquid L is in the upper or lower limit of the treatment liquid storage section 22 by being brought into contact with the treatment liquid L.

In the vicinity of the substrate treating apparatus 10, there is disposed a controller 6 including a closing signal output portion 61 and an opening signal output portion 62. The detection result of the level sensor unit 5 is constantly input to the controller 6 which in turn outputs the closing or opening signal to the control valve 30 based on the received detection result.

Specifically, when the upper limit sensor 51 detects the presence of the treatment liquid L, the opening signal is produced from the opening signal output portion 62 to the control valve 30 to open the same. On the other hand, when the lower limit sensor 52 detects the absence of the treatment liquid L, the closing signal is produced from the closing signal output portion 61 to the control valve 30 to close the same.

The control valve 30 is held in an opened state until the lower limit sensor 52 detects the absence of the treatment liquid L while is held in a closed state until the upper limit sensor 51 detects the presence of the treatment liquid L. In other words, if the level of the treatment liquid L rises above the position of the upper limit sensor 51, the control valve 30 is opened and held in the opened state until the lower limit sensor 52 detects the absence of the treatment liquid L. On the other hand, if the level of the treatment liquid L falls below the position of the lower limit sensor 52, the control valve 30 is closed and held in the closed state until the level of the treatment liquid L reaches the position of the upper limit sensor 51.

Further, the level control of the treatment liquid L will be described in more detail with reference to FIGS. 2A to 2D showing the level control of the treatment liquid L in the treatment liquid storage section 22.

Figure 2A:
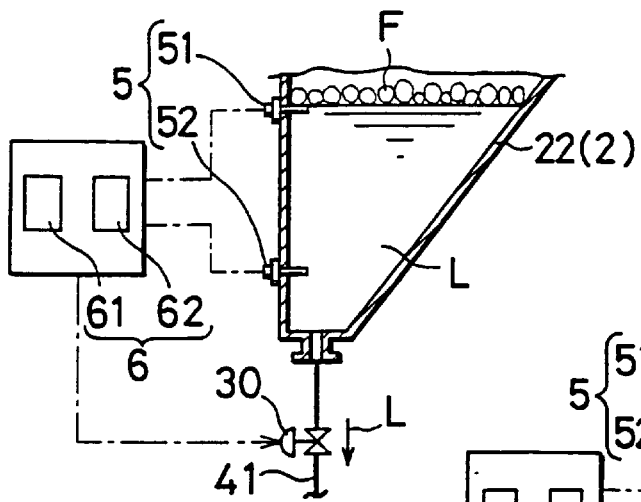
FIGS. 2A to 2D are diagrams showing level control of treatment liquid in a treatment liquid storage section of the apparatus, FIG. 2A showing a state where the level of the treatment liquid or the height of the surface of the treatment liquid is above an upper limit sensor, FIG. 2B showing a state where the level of the treatment liquid is about to fall between the upper limit sensor and a lower limit sensor, FIG. 2C showing a state where the level of the treatment liquid is below the lower limit sensor, and FIG. 2D showing a state where the level of the treatment liquid is about to rise between the upper and lower limit sensors.

In FIG. 2A, the level of the treatment liquid L in the treatment liquid storage section 22 is above the upper limit sensor 51. Accordingly, the upper limit sensor 51 detects the presence of the treatment liquid L, and its detection result is transmitted to the controller 6. As a result, the opening signal output portion 62 of the controller 6 produces the opening signal to the control valve 30.

Figure 2B:
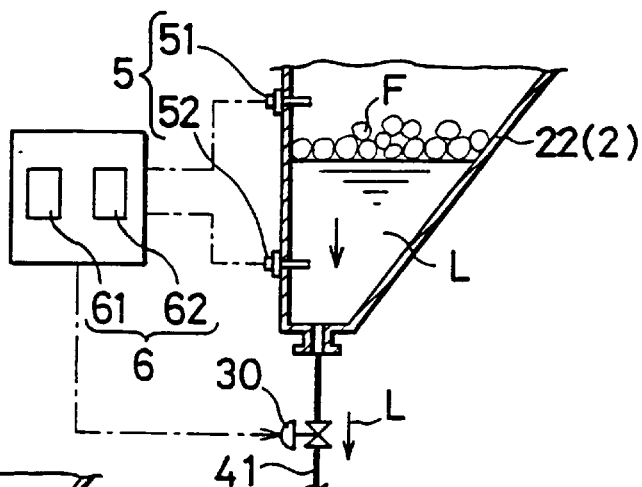

In FIG. 2B, the control valve 30 is opened, and the treatment liquid L consequently flows down through the opened control valve 30. Consequently, the level of the treatment liquid L lowers. In this case, the upper limit sensor 51 does not detect the presence of the treatment liquid L any longer. However, the output of the opening signal is kept to hold the control valve 30 open until the level of the treatment liquid L falls below the position of the lower limit sensor 52 and the lower limit sensor 52 detects the absence of the treatment liquid L.

Figure 2C:
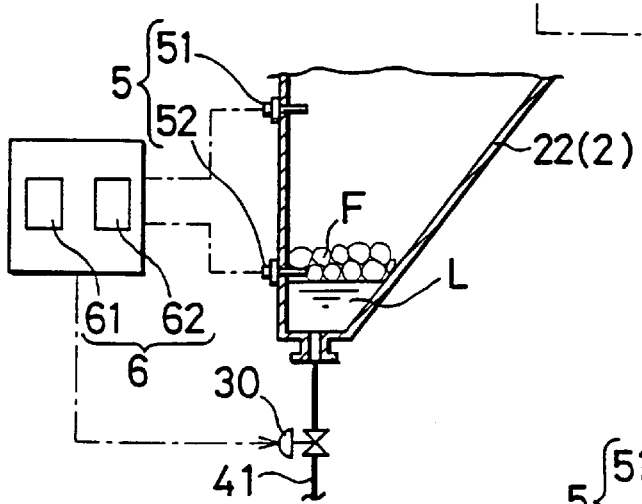

As shown in FIG. 2C, when the level of the treatment liquid L in the treatment liquid storage section 22 falls below the position of the lower limit sensor 52, the lower limit sensor 52 detects the absence of the treatment liquid L. Thereupon, the closing signal output portion 61 of the controller 6 produces the closing signal to the control valve 30 to close the control valve 30, thereby stopping the flow of the treatment liquid L down to the tank 3.

Figure 2D:
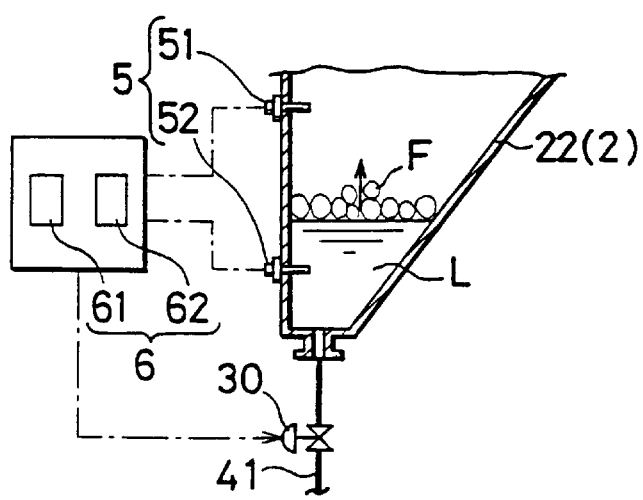

As shown in FIG. 2D, thereafter, the level of the treatment liquid L rises because of the treatment liquid L introduced into the treatment liquid storage section 22. In this case, the lower limit sensor 52 starts detecting the presence of the treatment liquid L. However, the output of the closing signal is kept to hold the control valve 30 closed until the level of the treatment liquid L rises above the position of the upper limit sensor 51 and the upper limit sensor 51 detects the presence of the treatment liquid L. The level of the treatment liquid L reaches the upper limit sensor 51, the treatment liquid storage section 22 coming back to the state shown in FIG. 2A. These operations are repeatedly performed to carry out the level control of the treatment liquid L in the storage section 22.

In the first embodiment, the treatment liquid L applied to the substrate B from the spray nozzles 24, after treating the substrate B in the specified manner, falls onto and flows along the slanted bottom wall 25 and the guiding plate 26 of the treatment section 2, and comes into the treatment liquid storage section 22.

The used treatment liquid L is temporarily stored in the storage section 22. The temporary storage of the used treatment liquid L allows generated bubbles to float upto the upper surface of the used treatment liquid L. Consequently, generated bubbles are collected over the upper surface of the used treatment liquid L in the storage section 22.

Depending upon the level of the treatment liquid L detected by the level sensor unit 5, the opening or closing signal is transmitted from the controller 6 to the control valve 30 to keep the level of the treatment liquid L in the treatment liquid storage section 22 between the upper limit sensor 51 and the lower limit sensor 52.

In this way, the treatment liquid L is stored in the treatment liquid storage section 22 in the state of not lowering below the lower limit sensor 52 or keeping at least the same level as the lower limit sensor 52. Accordingly, even if bubbles F generate in the treatment liquid L, these bubbles F stay on the upper surface of the treatment liquid L in the storage section 22. The bubbles F are not admitted into the tank 3 via the recovery passage 41. Thus, the generated bubbles are securely prevented from dispersing in the treatment liquid L in the tank 3. In the first embodiment, the lower limit sensor 52 of the level sensor unit 5, the controller 6 and the control valve 30 constitute a storage keeper.

Figure 3:
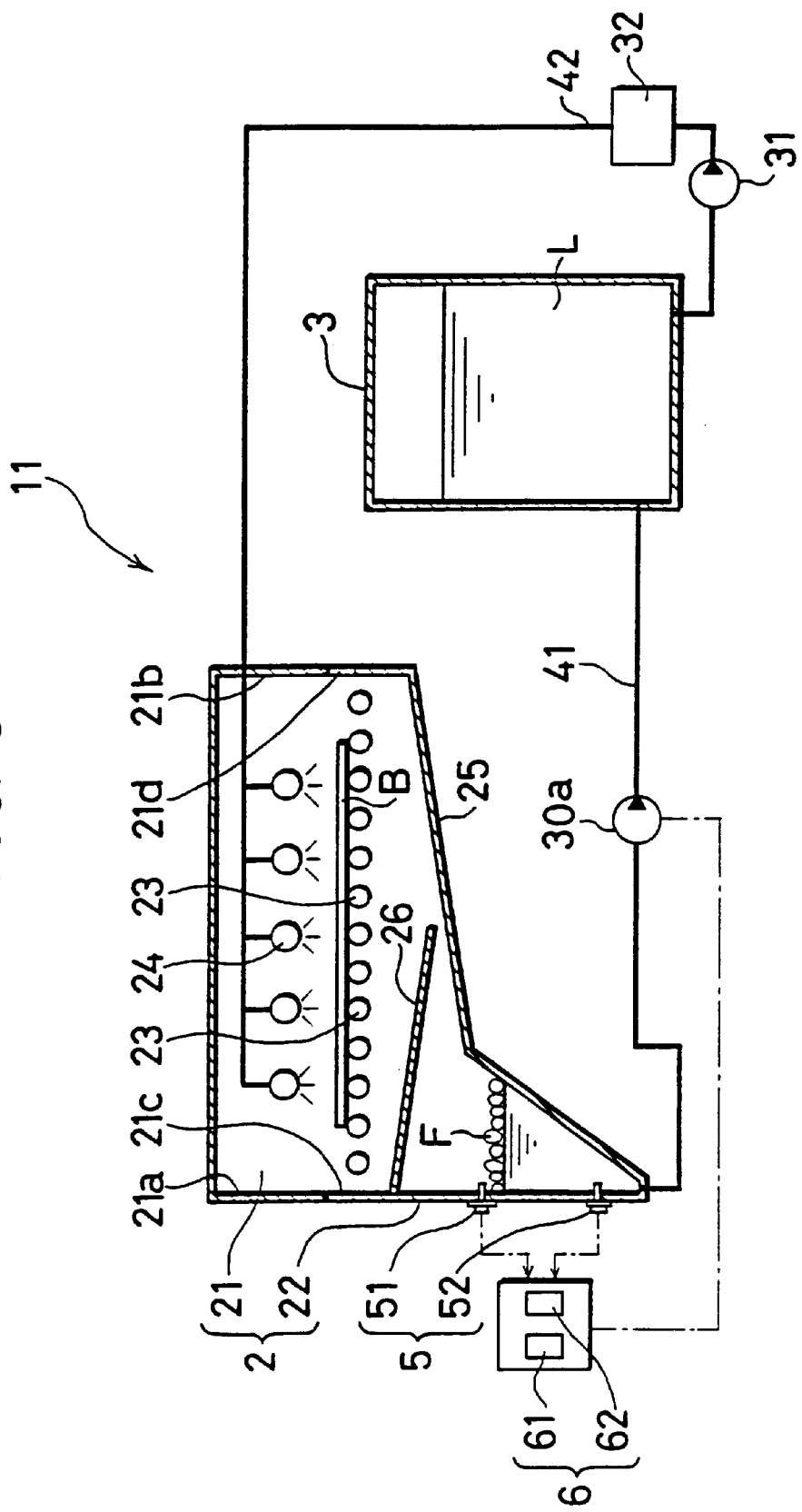
FIG. 3 is a diagram showing a second substrate treating apparatus according to the present invention.

FIG. 3 is a diagram showing a second substrate treating apparatus of the invention. The second substrate treating apparatus 11 is identical in its construction to the first substrate treating apparatus 10 except for the fact that instead of the control valve 30, a recovering pump 30a is disposed in a recovery passage 41, and treatment liquid L in a treatment liquid storage section 22 is forcibly admitted into a tank 3 by driving the recovering pump 30a, and a controller 6 outputs driving and suspending signals to the recovering pump 30a based on a detection result of a level sensor unit 5. In the second embodiment, the recovery passage 41 and the recovering pump 30a constitute a recovering system.

Specifically, the controller 6 has a driving signal output portion 61 and a suspending signal output portion 62. Detection results of the level sensor unit 5 are constantly input to the controller 6 which in turn produces the driving or suspending signal to the recovering pump 30a from the driving signal output portion 61 or suspending signal output portion 62 depending upon a received detection result. When an upper limit sensor 51 detects the presence of the treatment liquid L, the controller 6 produces the driving signal to the recovering pump 30a to drive the same. When a lower limit sensor 52 detects the absence of the treatment liquid L, the controller 6 produces the suspending signal to the recovering pump 30a to stop the same.

The recovering pump 30a is held in a driven state until the lower limit sensor 52 detects the absence of the treatment liquid L while is held in a suspended state until the upper limit sensor 51 detects the presence of the treatment liquid L. In other words, if the level of the treatment liquid L rises above the position of the upper limit sensor 51, the recovering pump 30a is driven until the lower limit sensor 52 detects the absence of the treatment liquid L. On the other hand, if the level of the treatment liquid L falls below the position of the lower limit sensor 52, the recovering pump 30a is suspended until the level of the treatment liquid L reaches the position of the upper limit sensor 51. In the second embodiment, the lower limit sensor 52 of the level sensor unit 5, the controller 6, and the recovering pump 30a constitute a storage keeper.

As mentioned above, in the second substrate treating apparatus 11, the treatment liquid L in the treatment liquid storage section 22 is forcibly flowed to the tank 3 by the recovering pump 30a. Accordingly, there is no restriction on the arranging position of the recovering pump 30a between the treatment section 2 and the tank 3 unlike the first substrate treating apparatus 10 which requires the arrangement of the control valve 30 in a vertical path.

In this way, the treatment liquid L is stored in the treatment liquid storage section 22 in the state of not lowering below the lower limit sensor 52 to keep bubbles F to stay on the upper surface of the treatment liquid L in the storage section 22, and prevent the bubbles F from entering the tank 3 via the recovery passage 41. Thus, the generated bubbles are securely prevented from dispersing in the treatment liquid L in the tank 3.

Figure 4:
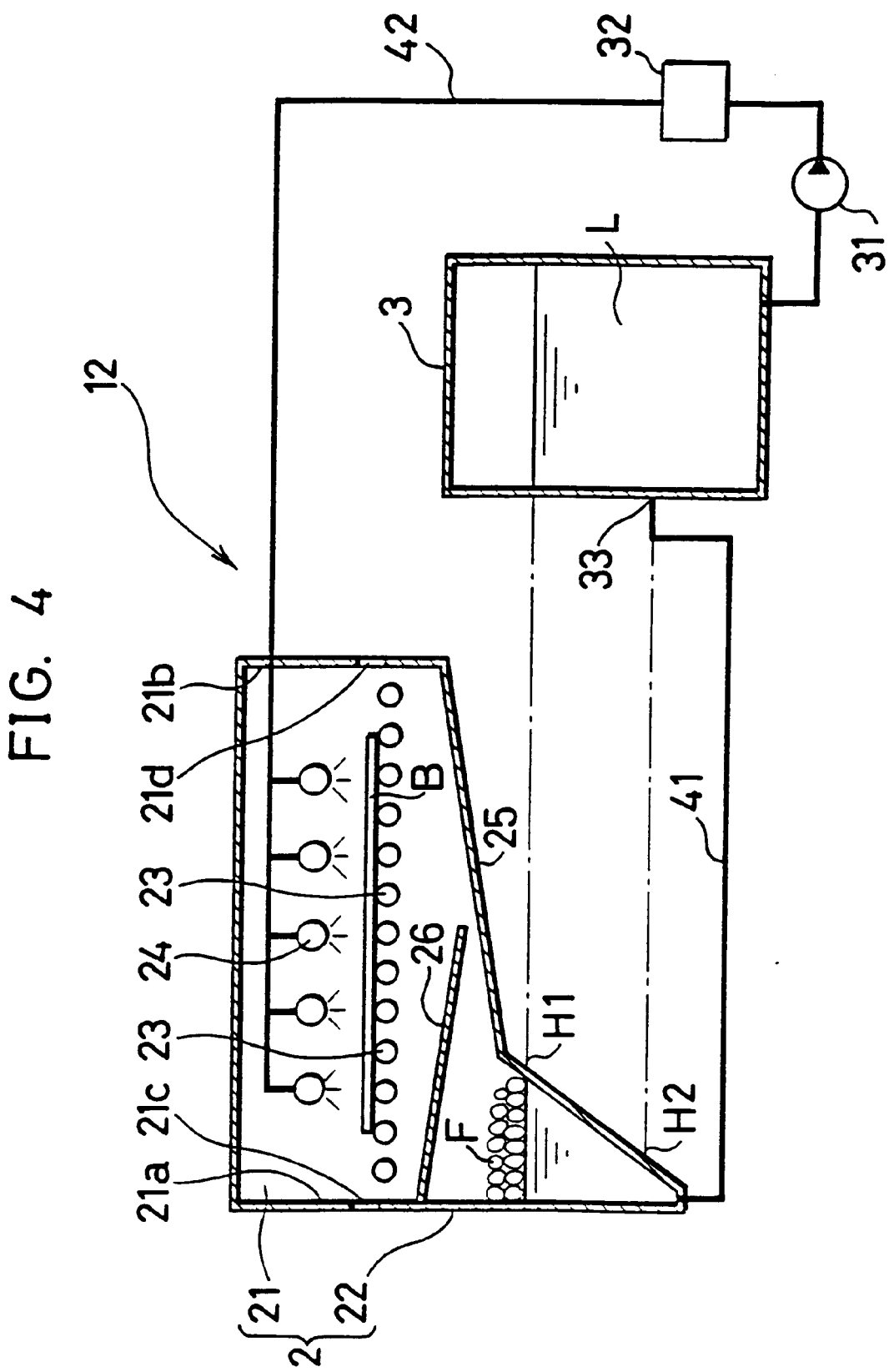
FIG. 4 is a diagram showing a third substrate treating apparatus according to the present invention.

FIG. 4 is a diagram showing a third substrate treating apparatus of the invention. Parts or elements identical to the first embodiment are indicated at like numerals or letters.

A third substrate treating apparatus 12, as shown in FIG. 4, is not provided with a control valve (as the first embodiment) or a recovering pump (as the second embodiment) in a passage from a treatment section 2 to a tank 3. In the third apparatus, however, a treatment liquid storage section 22 of a treatment section 2 and a tank 3 are placed in such a position that the surface of the treatment liquid L stored in the storage section 22 is on the same level as the surface of the treatment liquid L stored in the tank 3.

A recovery passage 41 is provided between a bottom of the treatment liquid storage section 22 and a side of the tank 3 at its bottom to communicate the treatment liquid storage section 22 and the tank 3 with each other at their bottoms.

An upper limit H1 and a lower limit H2 of the treatment liquid L stored in the treatment liquid storage section 22 are set in advance. The tank 3 has a volume capable of storing the treatment liquid L at not lower than the level of the upper limit H1 of the treatment liquid storage section 22. A connection port 33 is formed in a side of the tank 3 and is connected with an outflow end of the recovery passage 41. The connection port 33 is positioned at the same as or slightly above the level of the lower limit H2. The connection port 33 constitutes a storage keeper in the third embodiment.

In this construction, the surface level of the treatment liquid L in the storage section 22 changes with a variation in the surface level of the treatment liquid L in the tank 3. Accordingly, when the surface level of the treatment liquid L in the tank 3 is above the connection port 33, there is no likelihood that bubbles F on the upper surface of the treatment liquid L in the storage section 22 enters the tank 3. Also, even if the surface level of the treatment liquid L in the tank 3 lowers below the connection port 33, there is no likelihood that bubbles F on the upper surface of the treatment liquid L in the storage section 22 enters the tank 3 because the connection port 33 is located above the lower limit H2.

Figure 5:
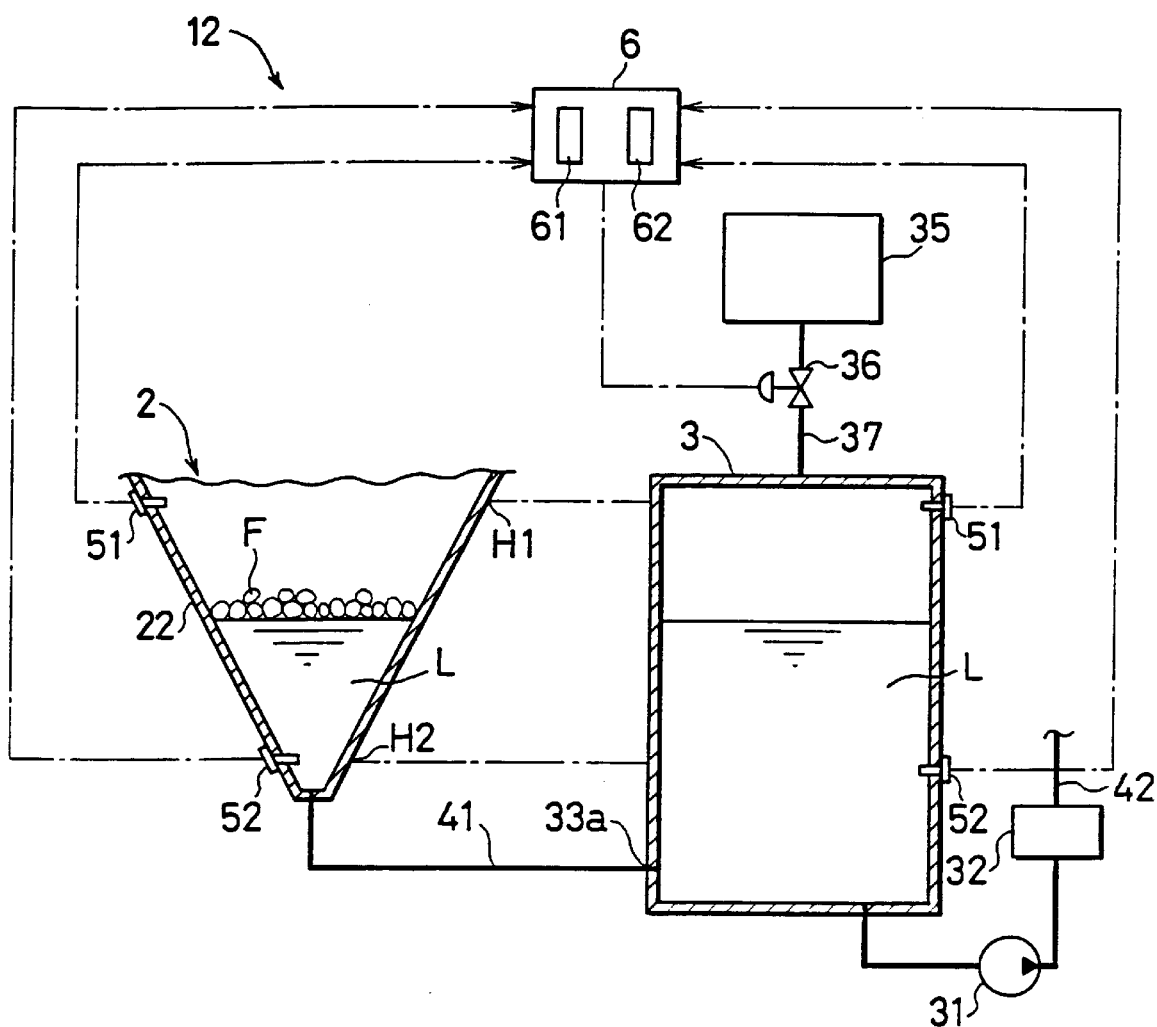
FIG. 5 is a diagram showing a modification of the third substrate treating apparatus.

FIG. 5 is a diagram showing a modification of the third substrate treating apparatus 12. In this modification, a connection port 33a for a recovery passage 41 is located below the level of a lower limit H2 for the treatment liquid L in the a treatment liquid storage section 22.

However, there is provided a level control system for controlling the surface level of the treatment liquid in the tank 3. The level control system includes a supplemental tank 35 connected with the tank 3 by a way of a supplemental passage 37, a control valve 36 provided in the supplemental passage 37, an upper limit sensor 51, a lower limit sensor 52, and a controller 6.

The upper and lower limit sensors 51 and 52 are provided in the tank 3 or the storage section 22 of the treatment section 2. The upper limit sensor 51 is located at the same level as the upper limit H1 and the lower limit sensor 52 is located at the same level as the lower limit H2.

The controller 6 includes a closing signal output portion 61 and an opening signal output portion 62. The supplemental tank 35 stores new treatment liquid L as supplement.

The surface level of the treatment liquid L in the tank 3 is controlled as follows. The upper and lower limit sensors 51 and 52 transmit their detected result to the controller 6. The controller 6 produces an opening signal from the opening signal output portion 62 to the control valve 36 to open the same to allow the supplemental treatment liquid to flow into the tank 3 when the lower limit sensor 52 detects the absence of the treatment liquid L in the tank 3 (or the storage section 22). When the upper limit sensor 51 detects the presence of the treatment liquid L in the tank 3 (or the storage section 22), the controller 6 produces a closing signal to the control valve 36 to close the same to stop the flow of supplemental treatment liquid to the tank 3. In this way, the surface level of the treatment liquid in the tank 3 is kept within the range between the upper and lower limits H1 and H2. In this modification, the level control system constitutes a storage keeper.

However, it should be noted that according to the present invention, such level control system is not absolutely required. It may be appreciated that an operator observes a variation in the surface level of the treatment liquid in the tank 3 and manually pours treatment liquid into the tank 3 to keep the storage amount in a specified amount when seeing the surface level is below the lower limit H2.

Figure 6:
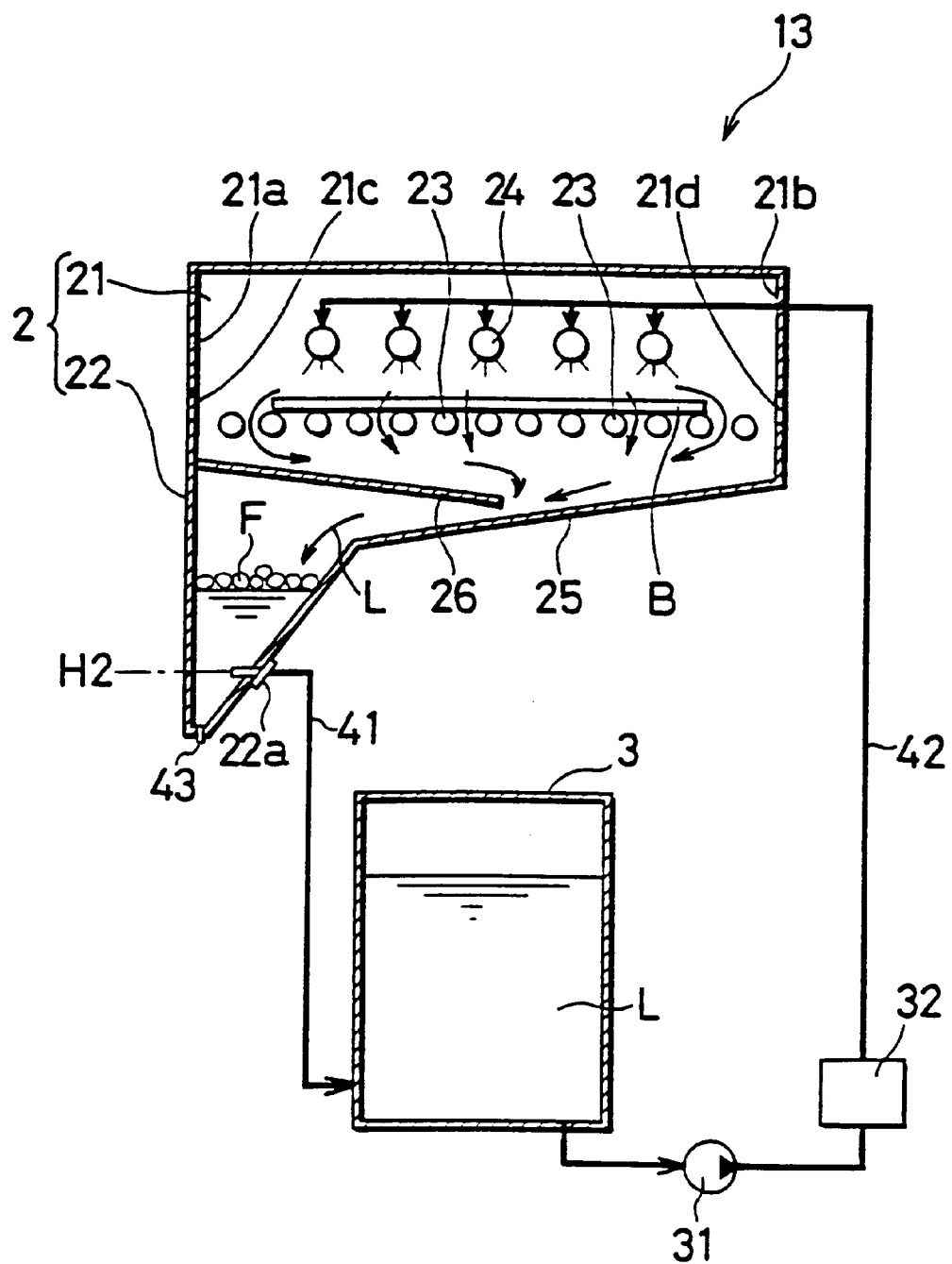
FIG. 6 is a diagram showing a fourth substrate treating apparatus according to the present invention.

FIG. 6 shows a diagram showing a fourth substrate treating apparatus of the invention. Parts or elements identical to the first embodiment are indicated at like numerals or letters.

In the foregoing embodiments, to prevent the treatment liquid from stagnating at a bottom of the treatment liquid storage section 22, the treatment liquid is drawn from the bottom of the storage section 22. In this embodiment, a connection port 22a is formed in a side of a treatment liquid storage section 22 at a lower limit level. The connection port 22a is formed in such a size as to allow the flow of the treatment liquid but interrupt the transfer of the bubbles. An inflow end of a recovering passage 41 is connected with the connection port 22a. Also, a discharge valve 43 is provided in a bottom of the treatment liquid storage section 22 to discharge the treatment liquid at a desired time.

In this construction, the treatment liquid below the connection port 22a is always stored and the bubbles are held on the upper surface of the treatment liquid because of being blocked at the connection port 22a. Accordingly, this embodiment makes it possible to eliminate the level sensor unit 5, controller 6, control valve 30, and recovering pump 30a which are necessary in the foregoing embodiments.

The present invention is not limited to the foregoing embodiments, but may be embodied in the following manners.

(1) Although the treatment liquid L is sprayed onto the upper surface of the substrate B by the spray nozzles 24 in the foregoing embodiments, spray nozzles may also be disposed below the rows of rollers 23 so that the treatment liquid L is sprayed onto the lower surface of the substrate B.

(2) Although the capacitance type level sensor unit 5 is used in the foregoing embodiments, a suitable level sensor of floating type, optical type, magnetic type or other type may be used depending upon the properties of treatment liquid and the number of bubbles.

(3) The bottom of the tank 3 may be set higher than the lower limit H2 in the third embodiment shown in FIG. 4. With this arrangement, even if a connection port for the recovering passage 41 is formed in a bottom wall of the tank 3, the level of the treatment liquid L in the treatment liquid storage section 22 does not fall below the lower limit H2. Accordingly, the transfer of the bubbles F to the tank 3 can be securely prevented.

As described above, when the sensor detects that the level of the treatment liquid in the storage section has fallen below the lower limit, the recovery of the treatment liquid is stopped in response to the control signal from the controller, thereby preventing the treatment liquid level in the treatment liquid storage section from lowering any further. Accordingly, the bubbles on the upper surface of the treatment liquid in the storage section are not admitted into the tank, and therefore the treatment liquid stored in the tank is free from bubbles. Thus, even if the treatment liquid in the tank is supplied to the substrate by driving the pump, since no bubbles are present in the treatment liquid, a nonuniform treatment of the substrate and a defective feed of the treatment liquid by the pump which are caused by the presence of the bubbles do not occur. This is effective in reducing the defect rate in the production of treated substrates and in securely applying the treatment liquid.

Further, when the sensor detects that the level of the treatment liquid in the storage section has risen above the upper limit, the controller outputs another control signal to start the recovery of the treatment liquid, thereby lowering the level of the treatment liquid in the storage section. Accordingly, an overflow of the treatment liquid in the treatment section can be securely prevented.

The level of the treatment liquid stored in the storage section is constantly found between the predetermined upper and lower limits by a feedback control of the controller based on the level of the treatment liquid detected by the sensor. Accordingly, the bubbles on the upper surface of the treatment liquid in the storage section are not admitted into the tank. This is very advantageous in securely preventing the bubbles from being applied to the substrate in a circulating manner and in automatically controlling the level of the treatment liquid in the storage section.

In the arrangement that the treatment liquid is recovered by the recovering pump disposed in the recovering passage, the treatment liquid in the storage section is forcibly flowed to the tank by driving the recovering pump. Accordingly, the treatment liquid can be fed despite the positional relationship of the storage section and the tank along the vertical direction, thereby enhancing the degree of freedom in terms of installation layout.

In the arrangement of positioning the bottom of the storage section above the surface of the treatment liquid in the tank and using the control valve, the treatment liquid can be recovered to the tank without providing a pump or other special driving force, thereby effectively reducing the operation costs.

In the arrangement that the storage section and the tank are arranged side by side such that their respective storage zones overlap along the vertical direction, the bubbles on the surface of the treatment liquid in the storage section are not admitted into the tank by executing such a level control as to constantly make the level of the treatment liquid in the tank higher than the bottom of the storage section. Accordingly, the tank is effectively free from bubbles. Further, since neither the control valve nor the recovering pump needs to be disposed in the recovering passage, the installation and operation costs can advantageously be reduced.

Further, the storage section is formed with the slanted bottom inner surface. The treatment liquid applied to the substrate falls onto this slanted bottom inner surface. Accordingly, an impact caused by the fall of the treatment liquid can be weakened by the slant of the bottom inner surface. This is effective in suppressing generation of bubbles in the treatment liquid.

Furthermore, there is provided the slanted treatment liquid guiding plate for receiving the treatment liquid from the substrate. Accordingly, an impact caused by the fall of the treatment liquid can be weakened by the slant of the guiding plate. This is effective in suppressing generation of bubbles in the treatment liquid.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. An apparatus for treating a substrate with a predetermined treatment liquid, comprising:

first storing means for storing said treatment liquid;

supplying means for supplying said treatment liquid stored by said first storing means to said substrate located at a predetermined position;

receiving means disposed beneath said substrate for receiving said treatment liquid after said treatment liquid has been applied to said substrate;

second storing means coupled to said receiving means for storing said treatment liquid received by said receiving means;

introducing means coupled to said second storing means at a certain position and coupled to said first storing means, said introducing means for introducing said treatment liquid stored by said second storing means to said first storing means; and controlling means coupled to said second storing means and coupled to said introducing means, said controlling means for controlling a level of said treatment liquid in said second storing means as long as said level is above a lower storage limit, said lower storage limit being above said certain position of said second storing means, whereby said controlling means prevents bubbles that can be about the surface of said treatment liquid stored by said second storing means from entering said introducing means when said level is above said lower storage limit.

2. An apparatus as defined in claim 1, wherein said controlling means includes:

first detecting said means for detecting level of the treatment liquid stored by said second storing means to detect that said level reaches said lower storage limit; and means for controlling said introducing means in accordance with the detected result of said first detecting means so that the treatment liquid stored by said second storing means is not introduced to said first storing means when said detecting means detects that said level reaches said lower storage limit.

3. An apparatus as defined in claim 2, further comprising:
second detecting means for detecting said level of the treatment liquid stored by said second storing means to detect that said level reaches a predetermined upper limit; and
means for controlling said introducing means in accordance with the detected result of said second detecting means so that the treatment liquid stored by said second storing means is introduced to said first storing means when said second detecting means detects that said level reaches said upper limit.

4. An apparatus as defined in claim 2, wherein:
said introducing means includes an introducing passage through which the treatment liquid stored by said second storing means can flow to said first storing means; and
said controlling means includes a valve provided in said introducing passage for permitting and interrupting the flow of the treatment liquid from said second storing means to said first storing means.

5. An apparatus as defined in claim 2, wherein:
said introducing means includes a recovering passage which connects said second storing means with said first storing means; and
said controlling means includes a pump provided in said recovering passage for sending the treatment liquid stored by said second storing means to said first storing means.

6. An apparatus as defined in claim 1, wherein:
said introducing means includes means for connecting said second storing means with said first storing means so that level of the treatment liquid stored by said second storing means is normally identical with that stored by said first storing means by connecting a bottom of said second storing means with a predetermined position of said first storing means, said predetermined position being higher than said lower storage limit of said second storing means.

7. An apparatus as defined in claim 1, further comprising second supplying means for supplying new treatment liquid to said first storing means, and supply controlling means for controlling the operation of said second supplying means.

8. An apparatus as defined in claim 7, wherein said supply controlling means includes:
level detecting means for detecting whether a level of the treatment liquid stored by said first storing means reaches a predetermined lower level; and
means for controlling the operation of said second supplying means in accordance with the detected result of said level detecting means so that the operation of said second supplying means starts when said level detecting means detects that the level of the treatment liquid stored by said first storing means reaches said predetermined lower level.

9. An apparatus as defined in claim 8, wherein said supply controlling means further includes:
second level detecting means for detecting whether level of the treatment liquid stored by said first storing means reaches a predetermined upper level; and
means for controlling the operation of said second supplying means in accordance with the detected result of said second level detecting means so that the operation of said second supplying means ceases when said second level detecting means detects that the level of the treatment liquid stored by said first storing means reaches said predetermined upper level.

10. An apparatus as defined in claim 1, further comprising means for discharging the treatment liquid stored by said second storing means.

11. An apparatus as defined in claim 1, wherein said receiving means includes a guiding plate slanted towards said second storing means for gathering the treatment liquid from the substrate.

12. An apparatus as defined in claim 1, wherein said second storing means includes a slanted bottom wall for gathering the treatment liquid at the bottom of said second storing means.

13. A method of treating a substrate with a predetermined treatment liquid, comprising the steps of:
supplying said treatment liquid into treatment section from a tank in which treatment liquid is stored;
applying said supplied treatment liquid onto said substrate located in said treatment section;
collecting said treatment liquid falling from said substrate;
storing said collected treatment liquid in a storage section, said collected treatment liquid including bubbles generated by said treatment liquid falling from said substrate to said storage section;
recovering said treatment liquid stored by said storage section to said tank; and
controlling said recovering step as long as a level of said treatment liquid stored in said storage section is maintained at a level higher than a lower storage limit of said storage section, whereby said bubbles are prevented from entering said tank when said level is higher than said lower storage limit.

14. An apparatus for treating a substrate with a predetermined treatment liquid, comprising:
first storing device storing said treatment liquid;
a supplying device supplying said treatment liquid stored by said first storing device to said substrate located at a predetermined position;
a receiving device disposed beneath the substrate and receiving said treatment liquid after said treatment liquid has been applied to said substrate;
a second storing device coupled to said receiving device and storing said treatment liquid received by said receiving device;
an introducing device connected to said second storing device at a certain position and coupled to said first storing device; said introducing device introducing said treatment liquid stored by said second storing device to said first storing device; and
a controlling device coupled to said second storing device and coupled to said introducing device, said controlling device controlling a level of said treatment liquid in said second storing device as long as said level is above a lower storage limit, said lower storage limit being above said certain position of said second storing device, whereby said controlling device prevents bubbles that can be about the surface of said treatment liquid stored by said second storing device from entering said introducing device when said level is above said lower storage limit.

15. An apparatus as defined in claim 14, wherein said controlling device includes:
first detector to detect said level of the treatment liquid stored by said second storing device to detect that said level reaches said lower storage limit; and
controller to control said introducing device in accordance with the detected result of said first detector so that the treatment liquid stored by said second storing device is not introduced to said first storing device when said first detector detects that said level reaches said lower limit.

16. An apparatus as defined in claim 15, further comprising:
second detector to detect level of the treatment liquid stored by said second storing device to detect that said level reaches a predetermined upper limit; and
said controller controlling said introducing device in accordance with the detected result of said second detector so that the treatment liquid stored by said second storing device is introduced to said first storing device when said second detector detects that said level reaches said upper limit.

17. An apparatus as defined in claim 15, wherein:
said introducing device includes an introducing passage through which the treatment liquid stored by said second storing device can flow to said first storing device; and
said controlling device includes a valve provided in said introducing passage for permitting and interrupting the flow of the treatment liquid from said second storing device to said first storing device.

18. An apparatus as defined in claim 15, wherein:
said introducing device includes a recovering passage which connects said second storing device with said first storing means; and
said controlling device includes a pump provided in said recovering passage for sending the treatment liquid stored by said second storing device to said first storing device.

19. An apparatus as defined in claim 14, wherein:
said introducing device connecting said second storing device with said first storing device so that level of the treatment liquid stored by said second storing device is normally identical with that stored by said first storing device by connecting a bottom of said second storing device with a predetermined position of said first storing device, said position being higher than said predetermined lower storage limit of said second storing device.

20. An apparatus as defined in claim 14, further comprising second supplying device to supply treatment liquid to said first storing device, and supply controlling device to control the operation of said second supplying device.

21. An apparatus as defined in claim 20, wherein said supply controlling device includes:
first level detector to detect whether a level of the treatment liquid stored by said first storing device reaches a predetermined lower level; and
controller to control the operation of said second supplying device in accordance with the detected result of said first level detector so that the operation of said second supplying device starts when said first level detector detects that the level of the treatment liquid stored by said first storing device reaches said predetermined lower level.

22. An apparatus as defined in claim 21, wherein said supply controlling device further includes:
second level detector to detect whether level of the treatment liquid stored by said first storing device reaches a predetermined upper level; and
controller to control the operation of said second supplying device in accordance with the detected result of said second level detector so that the operation of said second supplying device ceases when said second level detector detects that the level of the treatment liquid stored by said first storing device reaches said predetermined upper level.

23. An apparatus as defined in claim 14, further comprising discharge device to discharge the treatment liquid stored by said second storing device.

24. An apparatus as defined in claim 14, wherein said receiving device includes a guiding plate slanted towards said second storing device for gathering the treatment liquid from the substrate.

25. An apparatus as defined in claim 14, wherein said second storing device includes a slanted bottom wall for gathering the treatment liquid at the bottom of said second storing device.

* * * * *